United States Patent
Cha et al.

(10) Patent No.: US 7,688,667 B2
(45) Date of Patent: Mar. 30, 2010

(54) VOLTAGE CONVERTER CIRCUIT AND FLASH MEMORY DEVICE HAVING THE SAME

(75) Inventors: Jae Won Cha, Icheon-si (KR); Sam Kyu Won, Icheon-si (KR); Kwang Ho Baek, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 77 days.

(21) Appl. No.: 11/958,379

(22) Filed: Dec. 17, 2007

(65) Prior Publication Data
US 2009/0027958 A1    Jan. 29, 2009

(30) Foreign Application Priority Data
Jul. 25, 2007    (KR) .................. 10-2007-0074556

(51) Int. Cl.
G11C 5/14 (2006.01)
G11C 16/04 (2006.01)
G05F 1/10 (2006.01)

(52) U.S. Cl. ............. 365/226; 365/185.18; 365/189.09; 327/540; 327/543

(58) Field of Classification Search .......... 365/227, 365/226
See application file for complete search history.

(56) References Cited

U.S. PATENT DOCUMENTS

| | | | |
|---|---|---|---|
| 5,986,959 A * | 11/1999 | Itou | 365/226 |
| 6,313,694 B1 * | 11/2001 | Sohn | 327/541 |
| 6,333,669 B1 * | 12/2001 | Kobayashi et al. | 327/541 |
| 6,477,090 B2 * | 11/2002 | Yamaki et al. | 365/189.09 |
| 6,661,279 B2 * | 12/2003 | Yabe | 327/546 |
| 6,853,592 B2 * | 2/2005 | Kashiwazaki | 365/189.09 |
| 6,930,948 B2 * | 8/2005 | Lee et al. | 365/226 |
| 6,985,027 B2 * | 1/2006 | Yabe | 327/541 |
| 7,123,536 B2 * | 10/2006 | Kang | 365/226 |
| 7,319,361 B2 * | 1/2008 | Jin | 327/543 |
| 7,463,081 B2 * | 12/2008 | Jin | 327/540 |
| 2003/0210090 A1 * | 11/2003 | Kwak et al. | 327/540 |

FOREIGN PATENT DOCUMENTS

| KR | 1020070001726 A | 6/2005 |
|---|---|---|
| KR | 100648295 B1 | 11/2006 |
| KR | 1020070028974 A | 3/2007 |

* cited by examiner

*Primary Examiner*—Son L Mai
(74) *Attorney, Agent, or Firm*—Townsend and Townsend and Crew LLP

(57) ABSTRACT

A voltage conversion circuit includes a reference voltage generation unit for generating a reference voltage having a uniform level regardless of a level of an input voltage varying according to an operation mode; and a driver unit for generating and outputting an active voltage or a standby voltage using the reference voltage output by the reference voltage generation unit according to a control signal.

13 Claims, 4 Drawing Sheets

VOLTAGE CONVERTER CIRCUIT AND FLASH MEMORY DEVICE HAVING THE SAME

CROSS-REFERENCES TO RELATED APPLICATIONS

The present application is based on, and claims priority from, Korean Application Serial Number 2007-74556, filed on Jul. 25, 2007, the disclosure of which is hereby incorporated by reference herein in its entirety.

BACKGROUND OF THE INVENTION

The present invention relates to a flash memory device, and more particularly to a voltage converter circuit for providing an operation voltage to a flash memory device which has a reduced circuit area.

Recently, as demand for mobile devices such as a camcoder, digital camera, cellular phone, MP3 (MPEG-1 Layer3) player, etc., increases, efforts for improving operation performance of mobile devices have been made.

Since mobility of the mobile devices themselves is important, they are made to be portable and thus power is supplied to them via battery, etc. Accordingly, for improving the portability of the mobile devices, they tend to be designed lighter and to consume less power for lengthening their operation time period. External voltage (VCC) supplied by the mobile device is inputted to the flash memory device having a voltage down converter (VDC) and a flash memory chip. The VDC reduces the external voltage (VCC) and converts it to a voltage suitable for operating the flash memory chip.

FIG. 1A is a block diagram illustrating a flash memory device.

Referring to FIG. 1A, the flash memory 100 includes a voltage down converter (VDC) 110 for lowering an external voltage VCC input from an external source, e.g., from a mobile phone. The lowered voltage is provided to a flash memory chip 130 for its operation.

FIG. 1B is a block diagram of the VDC 110 of FIG. 1A.

Referring to FIG. 1B, a voltage down converter 110 includes a reference voltage generation unit 111 for outputting a reference voltage having a substantially constant level using an external voltage VCC, and a driver unit 112 for providing a voltage according an operation mode using the reference voltage output by the reference voltage generation unit 111.

The reference voltage output by the reference voltage generation unit 111 is substantially constant regardless of variation in the external voltage VCC. The driver unit 112 generates and outputs the voltage for operation of the flash memory chip using the reference voltage output by the reference voltage generation unit 111.

The reference voltage generation unit 111 is designed to ensure stability for Process, Voltage and Temperature (PVT) in order to output the reference voltage of a constant level (or uniform level).

FIG. 1C illustrates more detailed circuit diagrams of the reference voltage generation unit 111 and the driver unit 112. The reference voltage generation unit 111 includes an active reference voltage generation unit 114 for providing an active reference voltage in an active mode, and a standby reference voltage generation unit 115 for providing a standby reference voltage in a standby mode. The active reference voltage generation unit 114 includes a first comparator COM1 and a voltage driver 113.

The driver unit 112 includes an active voltage provision unit 116 for outputting a voltage VDC according to the active reference voltage VINT_REF provided by the standby reference voltage generation unit 114, and a standby voltage provision unit 117 for outputting a voltage VDC during the standby mode using the standby reference voltage STBY_REF output by the standby reference voltage generation unit 115. The active voltage provision unit 116 includes a second comparator COM2, a PMOS transistor P, and first and second diodes D1 and D2.

A background voltage VBG provided by the flash memory chip is input to the inverse terminal (−) of the first comparator COM1 of the active reference voltage generation unit 114. A feedback voltage Vfb input from the voltage driver 113 is input to the non-inverse terminal (+) of the first comparator COM1. The first comparator COM1 outputs a control voltage VREG based on the difference between the input voltages. The control voltage VREG is input to the voltage driver 113.

The voltage driver 113 receives the control voltage VREG provided by the first comparator COM1 and outputs the active reference voltage VINT_REF needed in the active mode. In this case, the voltage driver 113 delivers the active reference voltage output to the first comparator COM1 as the feedback voltage Vfb to output the control voltage VREG so as to output the uniform reference voltage.

A test bit decoder 118 provides a test bit for controlling the reference voltage output to the voltage driver 113 based on the characteristics and peripheral circumstance of the flash memory device 100.

The standby reference voltage generation unit 115 starts to operate according to a Power On Reset (POR) signal for initiating the operation of the flash memory device 100, and outputs the standby reference voltage STBY_REF provided in the standby mode. In this case, the standby mode refers to a state where the power supply turns on, and the chip waits for operation before substantial operation is started. The standby reference voltage generation unit 115 includes circuits similar to those of the active reference voltage generation unit 115. Since the magnitudes of voltages required for the active mode and the standby mode are different from each other, the specifications for the modes are different, so that the standby and active reference voltage generation units are separately configured using devices having different characteristics.

That is, the standby reference voltage generation unit 115 is designed as a circuit having rapid response time and low current consumption, such as a Widlar Reference Circuit, and the active reference voltage generation unit 115 is designed as a circuit which is less influenced from PVT circumstances rather than current consumption.

The flash memory device 100 requires little current in a standby state (e.g., about 10 uA) because the device is not operated. During an active state, a current in the hundreds of uA to dozens of mA is consumed. In this case, operation means operations performed on the flash memory device, e.g., programming data in the flash memory device 100, reading the data, or the like.

The active reference voltage VINT_REF output by the active reference voltage generation unit 114 is input to the non-inverse terminal (+) of the second comparator COM2 of the active voltage provision unit 116. A signal at a node K2 is input to the inverse terminal (−) of the second comparator COM2.

The second comparator COM2 outputs a control signal based on voltage difference between signals input to the inverse and non-inverse terminals. The control signal output by the second comparator COM2 is input to the gate of the PMOS transistor P. The PMOS transistor P is coupled between a power supply voltage and the node K1 and outputs the power supply voltage according to the voltage level of the control signal input to the gate thereof.

First and second diodes D1 and D2 are provided between the node K1 and a ground node and connected to each other at the node K2. The node K2 is coupled to the inverse terminal (−) of the second comparator COM2. The active voltage VDC is output through the node K1.

In this case, the second comparator COM2 is operated by an active enable control signal ENABLE_ACT. When the active mode is begun, the active voltage provision unit 116 is operated by receiving the active enable control signal ENABLE_ACT, thereby providing the active voltage.

The standby voltage provision unit 117 includes circuits similar to those of the active voltage provision unit 117, and is configured to use devices suitable to characteristics according the magnitude of the output voltage. The standby voltage provision unit 117 is operated when a standby enable signal ENABLE_STBY is received.

FIG. 1D is the operation timing diagram of FIG. 1B.

The operation of the VDC 110 of FIG. 1B is described below. When the active enable control signal ENABLE_ACT is at a low level, and the standby enable control signal ENABLE_STBY is at a high level, the standby voltage provision unit 117 is operated.

Furthermore, when the standby enable control signal ENABLE_STBY is at a low level, and the active enable control signal ENABLE_ACT is at a high level, the active voltage provision unit 116 is operated.

As describe above, the magnitudes of currents required for the active mode and the standby mode are different from each other, so that different reference voltage provision circuits are provided according to specs. Accordingly, the active reference voltage generation unit 114 and the standby reference voltage generation unit 115 are separately configured, which requires the use of more area.

SUMMARY OF THE INVENTION

The object of the present invention is to provide a voltage conversion circuit configured by integrating circuits for generating reference voltages so as to reduce the chip size of the flash memory device.

To achieve the above object, a voltage conversion circuit according to an embodiment of the present invention includes a reference voltage generation unit for generating a reference voltage having a uniform level regardless of a level of an input voltage varying according to an operation mode; and a driver unit for generating and outputting an active voltage or a standby voltage using the reference voltage output by the reference voltage generation unit according to a control signal.

The reference voltage generation unit includes a first reference voltage generation unit for outputting a first reference voltage having a uniform level while being not influenced by the voltage level varying according to the operation mode and external temperatures; and a second reference voltage generation unit for dividing the first reference voltage and outputting the divided voltage as a second reference voltage.

The first reference voltage generation unit is operated by a Power On Reset (POR) signal, and converts an external voltage inputted from the exterior into a first voltage having a predetermined magnitude and outputs the first voltage.

The first reference voltage generation unit includes a bandgap transistor for high voltages.

The second reference voltage generation unit includes a voltage output unit for outputting the second reference voltage having a uniform magnitude according to voltage difference between the first reference voltage and the control voltage; and voltage dividing means for dividing the second reference voltage based on a predetermined resistance ratio and feeding back the divided voltage to the voltage output unit as the control voltage.

The driver unit includes an active voltage provision unit for outputting an active voltage for active operation using the second reference voltage according to an input level of the control signal; and a standby voltage provision unit for outputting a standby voltage for standby operation using the second reference voltage according to the input level of the control signal.

When the control signal is at a first level, the active voltage output by the active voltage provision unit is output, and the control signal is at a second level, the standby voltage output by the standby voltage provision unit is output.

Furthermore, a flash memory device according to the present invention, includes a memory cell array having a plurality of multi-level cells respectively coupled to a plurality of bit line pairs and a plurality of word lines; a peripheral circuit unit for programming data in the memory cell array or reading data stored in the memory cell array; and a voltage conversion circuit for converting an external voltage input from an exterior into a voltage having a uniform level regardless of operation modes to generate a reference voltage and providing a voltage according to operation modes using the reference voltage to the memory cell array and the peripheral circuit unit.

The voltage conversion circuit includes a reference voltage generation unit including a first reference voltage generation unit for outputting a first reference voltage having a uniform level while being not influenced by the voltage level varying according to the operation mode and external temperatures, and a second reference voltage generation unit for dividing the first reference voltage and outputting the divided voltage as a second reference voltage required for operation; and a driver unit for generating and outputting different voltages according to operation modes using the second reference voltage output by the reference voltage generation unit.

The first reference voltage generation unit is operated by a Power On Reset (POR) signal, and converts an external voltage inputted from the exterior into a first voltage having a predetermined magnitude and outputs the first voltage.

The first reference voltage generation unit includes a bandgap transistor for high voltages.

The second reference voltage generation unit includes a voltage output unit for outputting the second reference voltage having a uniform magnitude according to voltage difference between the first reference voltage and the control voltage; and voltage dividing means for dividing the second reference voltage based on a predetermined resistance ratio and feeding back the divided voltage to the voltage output unit as the control voltage.

The driver unit includes an active voltage provision unit for outputting an active voltage for active operation using the second reference voltage according to an input level of the control signal; and a standby voltage provision unit for outputting a standby voltage for standby operation using the second reference voltage according to the input level of the control signal.

When the control signal is at a first level, the active voltage output by the active voltage provision unit is output, and the control signal is at a second level, the standby voltage output by the standby voltage provision unit is output.

DESCRIPTION OF SPECIFIC EMBODIMENTS

Hereinafter, specific embodiments of the present invention will be described in detail with reference to the accompanying drawings. However, the present invention is not limited to the embodiments set forth herein but can be implemented in different forms. Rather, the specific embodiments are merely provided to allow the present invention to be completely described herein and to fully convey the scope of the invention to those skilled in the art.

Figure 1A:
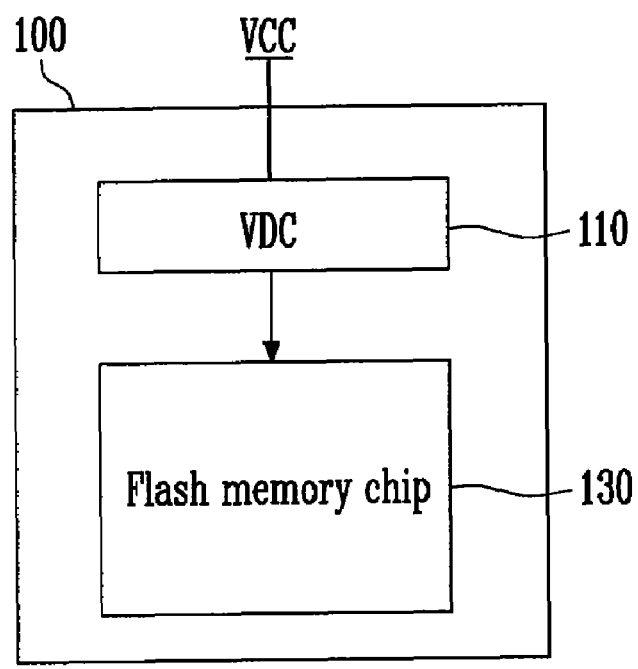
FIG. 1A is a block diagram showing a structure of supplying voltage in a flash memory chip.
Figure 1B:
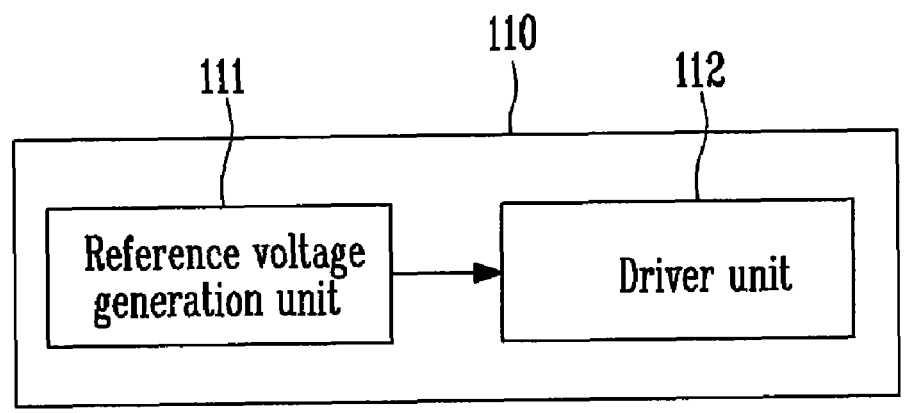
FIG. 1B is the block diagram of the VDC of FIG. 1A.
Figure 1C:
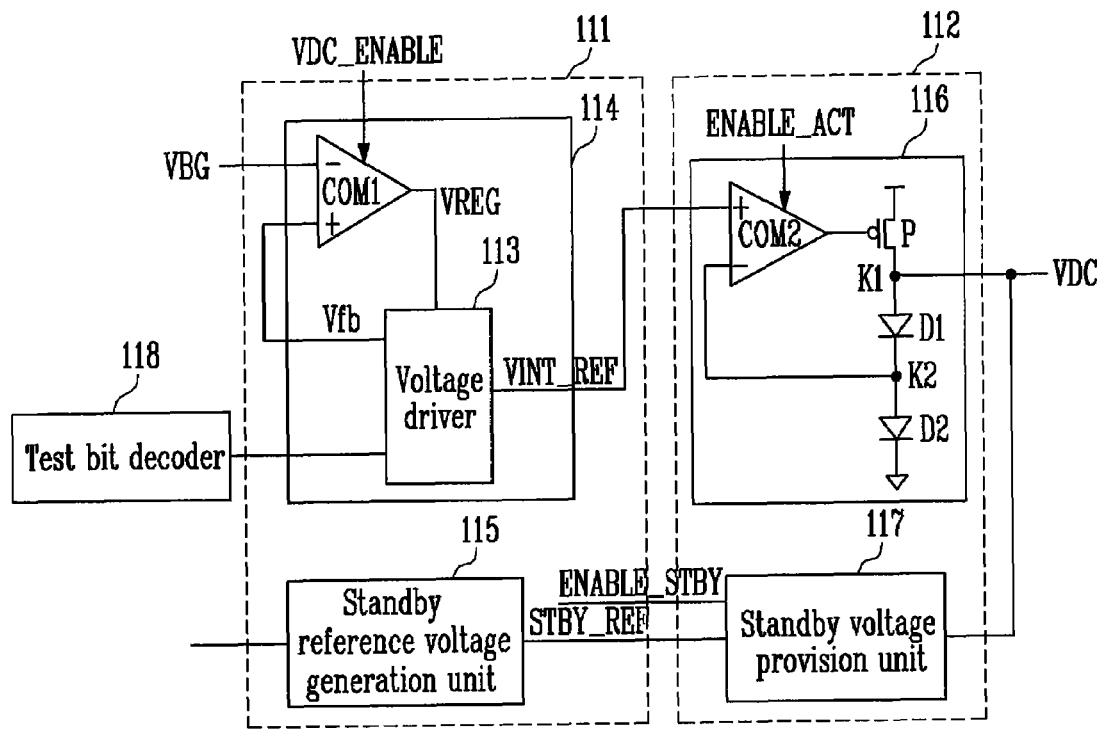
FIG. 1C is the detail circuit diagram of the FIG. 1B.
Figure 1D:
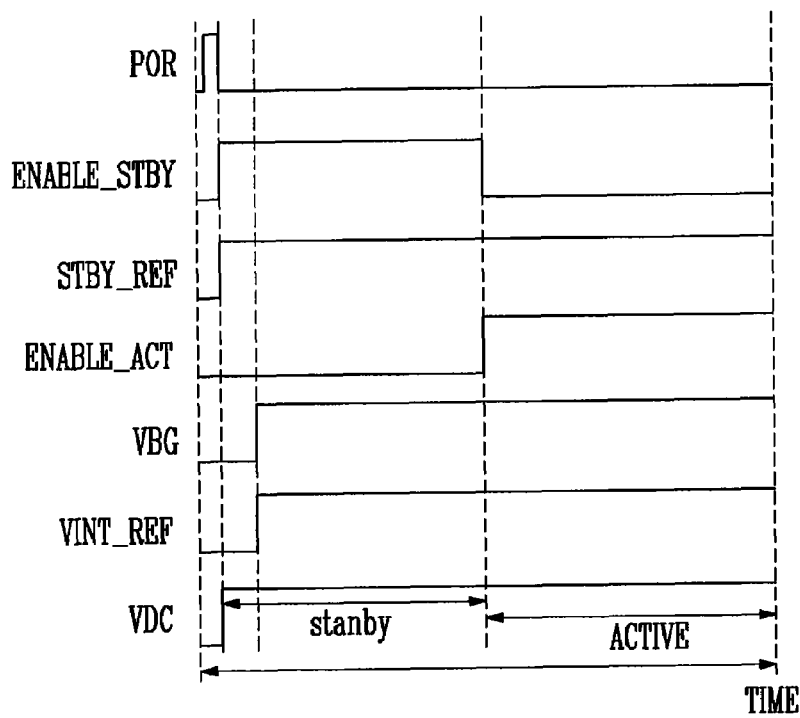
FIG. 1D is the operation timing diagram of FIG. 1B.
Figure 2A:
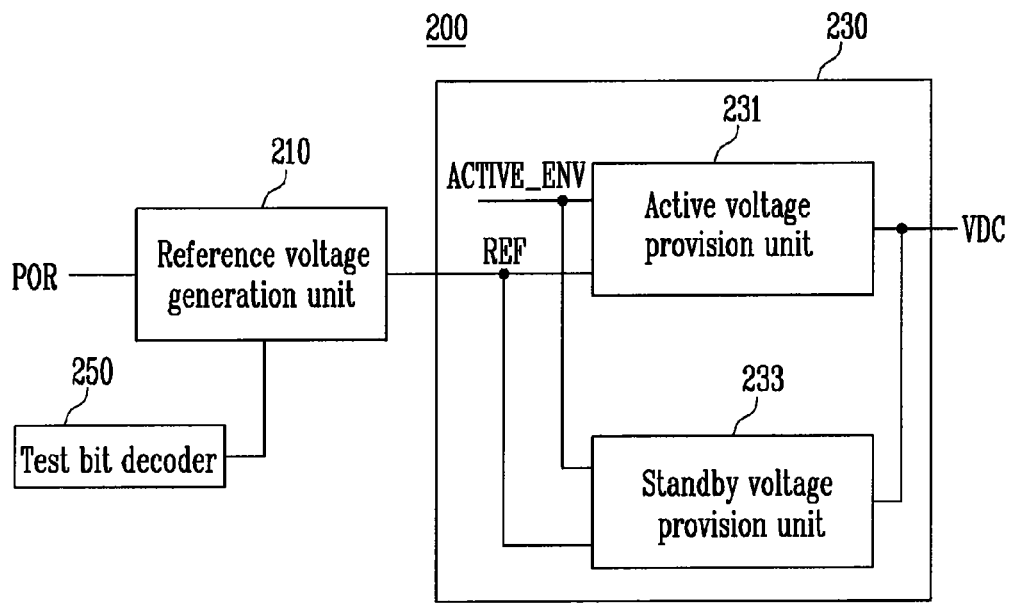
FIG. 2A is a block diagram illustrating the structure of a voltage down converter (VDC) according to an embodiment of the present invention.

FIG. 2A is a block diagram illustrating the structure of a voltage down converter (VDC) according to an embodiment of the present invention.

Referring to FIG. 2A, the VDC 200 according to the embodiment of the present invention includes a reference voltage generation unit 210 for reducing an external voltage VCC to a reference voltage REF.

A driver unit 230 includes an active voltage provision unit 231 for providing an active voltage required in an active mode and a standby voltage provision unit 233 for providing a standby voltage required in a standby mode. The reference voltage generation unit 210 outputs the reference voltage REF optimized for the surrounding circumstance of the flash memory device according to a test bit input by a test bit decoder 250.

The active voltage provision unit 231 is enabled by an active enable signal ACTIVE_ENV. The active voltage provision unit 231 outputs a voltage required in the active mode using the reference voltage REF output by the reference voltage generation unit REF in response to the active enable signal. When the active enable signal ACTIVE_ENV is at a high level, the active voltage provision unit 231 is enabled. When the active enable signal ACTIVE_ENV is at a low level, the standby voltage provision unit 233 is enabled. Accordingly, the active voltage or the standby voltage is output (VDC) based on the active enable signal ACTIVE_ENV.

The standby voltage provision unit 233 outputs a voltage required in the standby mode using the reference voltage REF provided by the reference voltage generation unit 210.

Figure 2B:
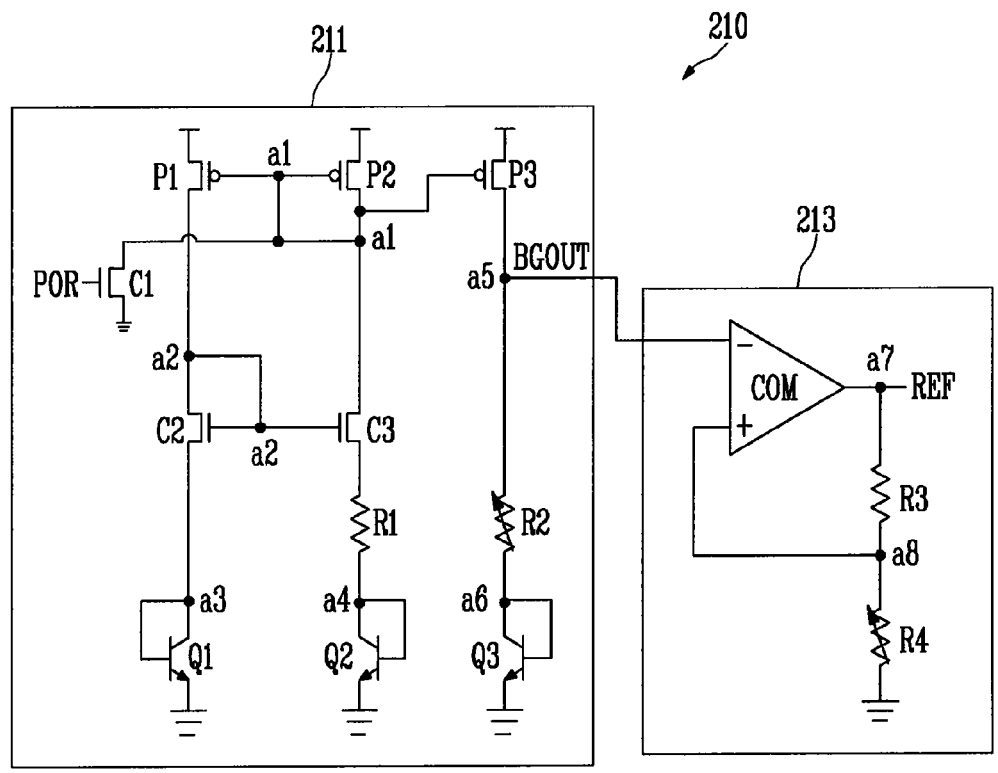
FIG. 2B is the detail circuit diagram of FIG. 2A.

FIG. 2B is a circuit diagram of the reference voltage generation unit 210 according to an embodiment of the present invention. The reference voltage generation unit 210 includes a reference voltage circuit 211 (or first voltage generation unit) for outputting a uniform voltage BGOUT, while not being influenced by surrounding circumstance using a band-gap CMOS transistor, and a reference voltage generation circuit 213 (or second voltage generation unit) for outputting the reference voltage REF having a uniform level for operation of the flash memory device using the voltage BGOUT output by the reference voltage circuit 211.

The reference voltage circuit 211 has band-gap CMOS transistors, thereby outputting the voltage BGOUT having a certain magnitude while not being influenced by surrounding circumstance PVT. The reference voltage generation unit 213 divides the voltage BGOUT output by the reference voltage circuit 211 according the ratio of resistances included in the circuit and outputs it as the reference voltage REF. The reference voltage generation circuit 213 buffers the output voltage BGOUT of the reference voltage circuit 211 and outputs it as the reference voltage REF.

The reference voltage circuit 211 includes first to third PMOS transistors P1 to P3, first to third CMOS transistors C1 to C3, first to third bipolar transistors Q1 to Q3 and first and second resistors R1 and R2.

The reference voltage generation unit 213 includes a comparator COM, and third and fourth resistors R3 and R4.

The first PMOS transistor P1 of the reference voltage circuit 211 is coupled between a power supply voltage and a second node a2, and the second PMOS transistor P2 is coupled between the power supply voltage and a first node a1.

The gates of the first and second PMOS transistors P1 and P2 are commonly coupled to the first node a1. Furthermore, the first CMOS transistor Cc is coupled between the first node a1 and a ground node, and Power On Reset (POR) is input to the gate of the first CMOS transistor C1.

The second CMOS transistor C2 is coupled between the second node a2 and a third node a3, and the third CMOS transistor C3 and the first resistor R1 are coupled serially to each other between the first node a1 and a fourth node a4. The gates of the second and third CMOS transistors C2 and C3 are commonly coupled to the second node a2.

The first bipolar transistor Q1 is coupled between the third node a3 and a ground voltage, and the base and collector thereof are commonly coupled to the third node a3. Furthermore, the second bipolar transistor Q2 is coupled between the fourth node a4 and the ground voltage and the base and collector thereof are commonly coupled to the fourth node a4.

The third PMOS transistor P3 is coupled between the power supply voltage and a fifth node a5, and the gate of the third PMOS transistor P3 is coupled to the first node a1.

The second resistor R2, which is a variable resistor, is coupled between the fifth node a5 and a sixth node a6, and the third bipolar transistor Q3 is coupled between the sixth node a6 and the ground voltage. The collector and base of the third bipolar transistor Q3 is commonly coupled to the sixth node a6.

The reference voltage circuit 211 is configured such that the first and second PMOS transistors P1 and P2 form a current mirror. Furthermore, the second and third CMOS transistors C2 and C3 form a current mirror.

When power is supplied to the flash memory device and the POR signal is applied at a high level for a certain interval, the flash memory device operates in the standby mode until receiving an operation command.

The first CMOS transistor C1 is turned on by the POR signal initially applied at high level. Therefore, the first node a1 is coupled to the ground node thereby becoming a low level. Furthermore, as the first node a1 becomes a low level, the first and second PMOS transistors P1 and P2 are turned on, thereby respectively delivering a power supply voltage to the second node a2 and the first node a1. In this case, the third transistor P3 is also turned on, thereby applying the power supply voltage to the fifth node a5.

As the first PMOS transistor P1 is turned on, the second node a2 becomes a high level and therefore the second and third CMOS transistors C2 and C3 are turned on. Furthermore, as the second PMOS transistor P2 is turned on, the first node a1 gradually becomes a high level. Therefore the third PMOS transistor P3 is gradually turned off, so that the voltage applied to the fifth node a5 decreases.

The voltage applied to the first node a2 flows to ground through the first resistor R1 and the first bipolar transistor Q2 as the third CMOS transistor C3 is turned on, thereby again having the low level. When the voltage has the low level, the second PMOS transistor P2 and the third PMOS transistor P3 are turned on, and are gradually turned off. Therefore, the voltage BGOUT having a uniform level is applied to the fifth node a5 after a certain interval.

In the reference voltage circuit 211 configured as above, the first to third CMOS transistors C1 to C4 which are the band-gap transistors are configured to handle high voltages, thereby stably operating both in the active mode and the standby mode. Furthermore, characteristics for temperatures are improved using the first to third bipolar transistors Q1 to Q3, thereby outputting a uniform voltage BGOUT while not being influenced by surrounding circumstances. That is, the voltage BGOUT is substantially constant and is not influenced significantly by the surrounding circumstances.

The voltage BGOUT of the fifth node a5 is input to the reference voltage generation circuit 213.

The comparator COM of the reference voltage generation circuit 213 outputs the reference voltage REF based on results from comparing the voltage BGOUT input to an inverse terminal (−) and the voltage of a eighth node a8 input to a non-inverse terminal (+).

The third resistor R3 and the fourth resistor R4 are coupled serially to each other between a seventh node a7 and the ground node. The voltage at the seventh node a7 is divided according to the ratio of resistances of the third and fourth resistors R3 and R4. The divided voltage is input to the non-inverse terminal of the comparator COM.

Therefore, according to the ratio of resistances of the third and fourth resistors and the voltage BGOUT, the reference voltage having the uniform level is output at the seventh node a7.

A timing diagram according to the above-described operation of the reference voltage generation unit 210 according to the embodiment of the present invention is described below.

Figure 2C:
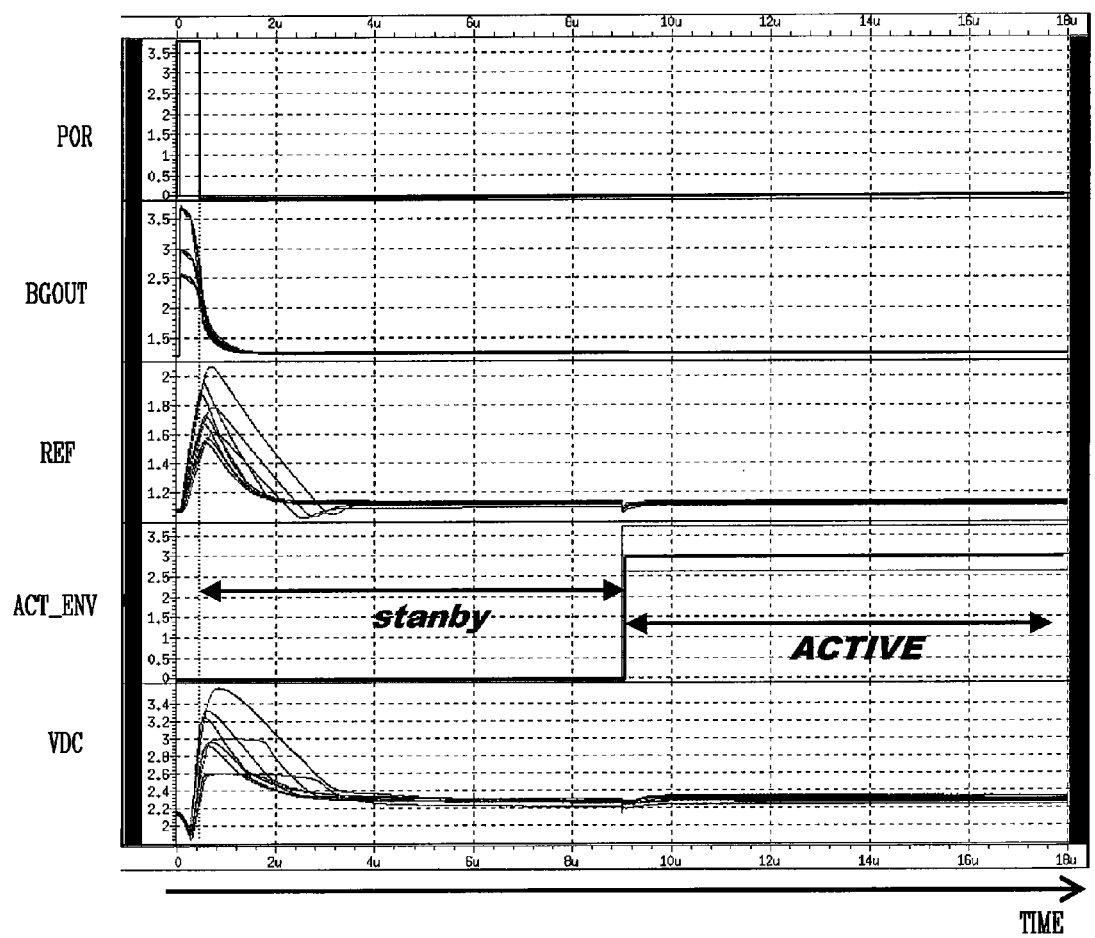
FIG. 2C is the operation timing diagram of FIG. 2A.

FIG. 2C is the operation timing diagram of FIG. 2A.

Referring to FIG. 2C, the voltage BGOUT at the fifth node a5 maintains a uniform level and is output according to the POR signal, so that it can be known that the reference voltage REF is maintained at the uniform level and output. In this case, the voltage level of the reference voltage REF is uniformly maintained regardless of the standby mode and the active mode.

Therefore, the flash memory device having the VDC including the reference voltage generation unit 210 according to the embodiment of the present invention operates using the reference voltage provided by one reference voltage generation unit 210 regardless of an operation mode, so that the area occupied by the reference voltage generation unit 210 is decreased, thereby being advantageous in miniaturization.

Although the present invention has been described in preferred embodiment, it is not intended to limit the invention thereto. Those who are skilled in this technology can still make various alterations and modifications without departing from the scope and spirit of this invention.

What is claimed is:

1. A voltage conversion circuit, comprising:
    a reference voltage generation unit to generate a reference voltage having a substantially uniform level regardless of a variation in a level of an input voltage according to an operation mode, wherein the reference voltage generation unit comprises:
        a first voltage generation unit to output a first reference voltage having a substantially uniform level without being influenced by the variation in the voltage level varying according to the operation mode and external temperatures, the first voltage generation unit being operated by a Power On Reset (POR) signal, wherein the first voltage generation unit converts a voltage inputted from an external source into a first voltage having a predetermined magnitude and outputs the first voltage, and
        a second voltage generation unit to divide the first reference voltage and output the divided voltage as a second reference voltage; and
    a driver unit to generate and output an active voltage or a standby voltage using the reference voltage output by the reference voltage generation unit according to a control signal.

2. The voltage conversion circuit as defined in claim 1, wherein the first voltage generation unit includes a band-gap transistor for high voltages.

3. The voltage conversion circuit as defined in claim 1, wherein the second voltage generation unit comprises:
    a voltage output unit to output the second reference voltage having a substantially uniform magnitude according to a voltage difference between the first reference voltage and the control signal; and
    a voltage dividing unit to divide the second reference voltage based on a predetermined ratio, the voltage dividing unit feeding back the divided voltage to the voltage output unit as the control signal.

4. The voltage conversion circuit as defined in claim 1, wherein the driver unit comprises:
    an active voltage provision unit to output the active voltage for active operation using the second reference voltage according to an input level of the control signal; and
    a standby voltage provision unit to output the standby voltage for standby operation using the second reference voltage according to the input level of the control signal.

5. The voltage conversion circuit as defined in claim 4, wherein when the control signal is at a first level, the active voltage is output, and when the control signal is at a second level, the standby voltage is output.

6. A flash memory device, comprising:
    a memory cell array having a plurality of multilevel cells:
    a peripheral circuit unit to program data in the memory cell array or read data stored in the memory cell array; and
    a voltage conversion circuit to convert a voltage input from an external source outside of the flash memory device into a voltage having a substantially uniform level regardless of operation modes to generate a reference voltage, and provide a voltage according to operation modes using the reference voltage to the memory cell array and the peripheral circuit unit,
    wherein the voltage conversion circuit comprises:
        a reference voltage generation unit comprising:
            a first voltage generation unit configured to output a first reference voltage having a substantially uniform level regardless of a variance in the external voltage according to the operation mode and external temperatures, and
            a second voltage generation unit configured to divide the first reference voltage and output the divided voltage as a second reference voltage required for operation; and a driver unit configured to generate and out put different voltages according to operation modes using the second reference voltage output by the reference voltage generation unit according to a control signal.

7. The flash memory device as defined in claim 6, wherein the first voltage generation unit is operated by a Power On Reset (POR) signal, and converts the external voltage into a first voltage having a predetermined magnitude and outputs the first voltage.

8. The flash memory device as defined in claim 6, wherein the first voltage generation unit includes a band-gap transistor for high voltages.

9. The flash memory device as defined in claim 6, wherein the second voltage generation unit comprises:

a voltage output unit to output the second reference voltage having a substantially uniform magnitude according to voltage difference between the first reference voltage and the control signal; and a voltage dividing unit to divide the second reference voltage based on a predetermined ratio and feeding back the divided voltage to the voltage output unit as the control signal.

10. The flash memory device as defined in claim 6, wherein the driver unit comprises:

an active voltage provision unit to output the active voltage for active operation using the second reference voltage according to an input level of the control signal; and a standby voltage provision unit to output standby voltage for standby operation using the second reference voltage according to the input level of the control signal.

11. The flash memory device as defined in claim 10, wherein when the control signal is at a first level, the active voltage is output by the voltage conversion unit, and when the control signal is at a second level, the standby voltage is output by the voltage conversion unit.

12. A flash memory device, comprising:

a flash memory chip having a memory cell array configured to store data and a peripheral circuit unit configured to program data into or read data from the memory cell array;

a single reference voltage generation unit configured to output a reference voltage according to a test bit input;

an active voltage provision unit configured to receive the reference voltage and an enable signal, the active voltage provision unit being configured to output an active voltage during an active state; and a standby voltage provision unit configured to receive the reference voltage and an enable signal, the standby voltage provision unit being configured to output a standby voltage during a standby state, wherein the active and standby voltages arc applied to the flash memory chip.

13. The flash memory device of claim 12, wherein the enable signal of the active provision unit and the enable signal of the standby voltage provision unit are the same enable signal, wherein the active voltage provision unit is enabled when the enable signal is in a first state and the standby voltage provision unit is enabled when the enable signal is in a second state.

* * * * *